(12) United States Patent
Cali et al.

(10) Patent No.: US 9,479,185 B2
(45) Date of Patent: Oct. 25, 2016

(54) MODIFIED DELTA-SIGMA MODULATOR FOR PHASE COHERENT FREQUENCY SYNTHESIS APPLICATIONS

(71) Applicant: BAE SYSTEMS Information and Electronic Systems Integration Inc., Nashua, NH (US)

(72) Inventors: Joseph D. Cali, Nashua, NH (US); Steven E. Turner, Nashua, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 14/968,180

(22) Filed: Dec. 14, 2015

(65) Prior Publication Data

US 2016/0173111 A1    Jun. 16, 2016

Related U.S. Application Data

(60) Provisional application No. 62/091,042, filed on Dec. 12, 2014.

(51) Int. Cl.
*H03L 7/06* (2006.01)
*H03L 7/18* (2006.01)
*H03M 7/30* (2006.01)

(52) U.S. Cl.
CPC .......... *H03L 7/1806* (2013.01); *H03M 7/3033* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 6,107,843 A * | 8/2000 | de Gouy | H03L 7/1976 327/105 |
| 8,115,519 B2 | 2/2012 | Turner | |
| 8,664,990 B2 | 3/2014 | Turner et al. | |
| 2012/0075132 A1* | 3/2012 | Lai | H03M 3/38 341/143 |
| 2015/0091745 A1* | 4/2015 | Pagnanelli | H03M 3/468 341/143 |
| 2015/0145566 A1* | 5/2015 | Perrott | H03L 7/0991 327/154 |
| 2015/0222280 A1* | 8/2015 | Allan | H03L 7/083 327/157 |
| 2016/0173111 A1* | 6/2016 | Cali | H03L 7/1806 327/156 |
| 2016/0226502 A1* | 8/2016 | Cali | H03L 7/1974 |

* cited by examiner

*Primary Examiner* — Adam Houston
(74) *Attorney, Agent, or Firm* — Finch & Maloney PLLC; Daniel J. Long (57) ABSTRACT

A phase coherent fractional-N phase-locked loop synthesizer for maintaining phase coherence of a synthesized frequency includes a phase coherent delta-sigma modulator (DSM) having a plurality of feed-forward accumulator stages. The DSM is operatively coupled to a reference clock configured to generate a cyclical reference signal. The DSM configured to count a number of cycles of the reference signal, to cause, at each cycle of the reference signal, each of the stages of the DSM to accumulate a sum of a previous stage of the DSM, and to multiply each sum by a fractional divide word to produce a multiplier output, thereby causing the DSM to output a sequence of signals that tracks with the reference clock.

18 Claims, 7 Drawing Sheets

FIG. 1

(Prior Art)

MODIFIED DELTA-SIGMA MODULATOR FOR PHASE COHERENT FREQUENCY SYNTHESIS APPLICATIONS

RELATED APPLICATIONS

This application claims the benefit of U.S. Provisional Patent Application Ser. No. 62/091,042, filed Dec. 12, 2014, which is hereby incorporated by reference in its entirety.

STATEMENT OF GOVERNMENT INTEREST

This invention was made with U.S. Government support under Contract No. HR0011-12-C-0083 awarded by the Defense Advanced Research Projects Agency (DARPA). The U.S. Government has certain rights in this invention.

TECHNICAL FIELD

The present disclosure relates generally to frequency synthesis, and more particularly to phase coherent frequency synthesis applications using a Delta-Sigma Modulator (DSM, $\Delta\Sigma$ Modulator, or Sigma-Delta $\Sigma\Delta$ Modulator).

BACKGROUND

Fractional-N phase-locked loops (PLLs) can be used for synthesizing frequencies at a non-integer scalar frequency of an input reference signal. Phase coherent means that the phase relationship between the input reference signal and the output signal is deterministic. However, it has been found in existing fractional-N PLLs that when the PLL tunes away from one frequency to another frequency and returns to the original frequency, the relationship between the phase of the output signal and the phase of the input reference signal is not phase coherent. In other words, when changing from a frequency A to a frequency B and then back to the frequency A signal, the phase of the frequency A signal is not necessarily matched to that of the previously generated frequency A signal. Further, with existing fractional-N phase-locked loops, the phase difference between an originally-generated frequency A signal and a subsequently-generated frequency A signal may be significantly more than a rounding error of a few degrees.

In fractional-N PLL architectures, a DSM can be used to generate a sequence that enables fractional reference frequency tuning of a voltage-controlled or digitally-controlled oscillator. The DSM reduces the magnitude of fractional spurs near the PLL carrier in comparison to single accumulator fractional-N PLLs. For phase coherency, the PLL should return to the same phase relative to the PLL reference. However, DSMs may have hidden states that cause the PLL to return to a random phase relative to the reference when tuning away from a frequency and back again. This occurrence may break phase coherency. Phase coherency is important when considering multiple instances of the frequency synthesizers in a system.

U.S. Pat. No. 8,115,519, which is incorporated in this disclosure by reference in its entirety, discloses a phase accumulator that generates phase data for a direct digital synthesis (DDS) device based on a reference phase to provide analog sinusoidal outputs that are locked to the reference phase, and thus are phase coherent. The frequency of a sinusoidal DDS output may be controlled by changing a frequency control word (FCW) provided to the phase accumulator, without affecting the incrementing reference phase. The sinusoidal DDS output is based on a multiple of the FCW and the reference phase, and thus remains locked to the reference phase, providing phase coherency even when the FCW changes to change the frequency.

U.S. Pat. No. 8,664,990, which is incorporated in this disclosure by reference in its entirety, discloses a fractional-N phase-locked loop (PLL) in which the frequency control word multiplies by the output of a reference counter to provide the carry bit utilized in n/n+1 switching.

SUMMARY

In accordance with an embodiment of the present disclosure, an apparatus for phase coherent frequency synthesis applications using a Delta-Sigma Modulator (DSM) is provided. A phase coherent fractional-N phase-locked loop synthesizer for maintaining phase coherence of a synthesized frequency includes a phase detector and a phase coherent delta-sigma modulator (DSM) having a plurality of feed-forward accumulator stages. The DSM and the phase detector are each clocked by a reference clock, which is configured to generate a cyclical reference signal. The DSM is configured to count a number of cycles of the reference signal. The DSM is further configured to cause, at each cycle of the reference signal, each subsequent stage of the stages of the DSM to accumulate a sum of a previous stage of the DSM, and to multiply each sum by a fractional divide word to produce a multiplier output, thereby causing the DSM to output a sequence of words that have a deterministic relationship with respect to the reference clock. In some cases, the DSM is configured to control a divide ratio in an analog or digital fractional-N phase-locked loop such that a phase of the synthesized frequency is deterministic from a given point in time with respect to the reference signal. In some cases, the DSM is configured to shape the quantization noise of a numerically controlled oscillator (NCO) operatively coupled to the reference clock, thereby maintaining no phase bias. In some such cases, the DSM is configured to compare a truncated multiplied output of each stage of the DSM with a previous truncated multiplied output of the same stage, and to generate carry-out bits for a delta path of the DSM based on the comparison. In some cases, the stages are serially arranged. In some cases, the number of cycles of the reference signal is the number of cycles of the reference signal generated by the reference clock since a given reset event. In some cases, the synthesizer includes a plurality of phase coherent fractional-N phase-locked loop synthesizers.

In accordance with another embodiment of the present disclosure, a methodology for phase coherent frequency synthesis applications using a Delta-Sigma Modulator (DSM) is provided. A method of maintaining phase coherence of a synthesized frequency using a phase coherent delta-sigma modulator (DSM) includes counting, by a phase coherent delta-sigma modulator (DSM) having a plurality of feed-forward accumulator stages, a number of cycles of a reference signal generated by a reference clock operatively coupled to the DSM. The method further includes causing, at each cycle of the reference signal, each of a plurality of stages of the DSM to accumulate a sum of a previous stage of the DSM, and multiplying each sum by a fractional divide word, thereby causing the DSM to output a sequence of signals that tracks with the reference clock. In some cases, the method includes controlling a divide ratio in an analog or digital fractional-N phase-locked loop such that a phase of the synthesized frequency is deterministic from a given point in time with respect to the reference signal. In some cases, the method includes shaping, by a numerically controlled oscillator (NCO) operatively coupled to the reference clock, quantization noise due to phase truncation, thereby maintaining no phase bias. In some cases, the method includes truncating the result of multiplying the sum by the fractional divide word. In some such cases, the method includes comparing the truncated result of each stage of the DSM with a previous truncated multiplied result of the same stage, and generating carry-out bits for a delta path of the DSM based on the comparison. In some cases, the stages are serially arranged. In some cases, the number of cycles of the reference signal is the number of cycles of the reference signal generated by the reference clock since a given reset event.

In accordance with another embodiment of the present disclosure, a phase coherent fractional-N phase-locked loop synthesizer for maintaining phase coherence of a synthesized frequency includes a reference clock and means operatively coupled to the reference clock. The means is configured to output a sequence of signals that tracks with the reference clock. In some cases, the means is configured to control a divide ratio in an analog or digital fractional-N phase-locked loop such that a phase of the synthesized frequency is deterministic from a given point in time with respect to the reference signal. In some cases, the means is configured to shape the quantization noise from phase truncation in a numerically controlled oscillator (NCO) operatively coupled to the reference clock, thereby maintaining no phase bias. In some such cases, the means is configured to compare a truncated result of an accumulator stage of a DSM with a previous truncated multiplied result of the same stage, and generate carry-out bits for a delta path of the DSM based on the comparison. In some cases, the synthesizer includes a plurality of phase coherent fractional-N phase-locked loop synthesizers.

BRIEF DESCRIPTION OF THE DRAWINGS

Embodiments of the disclosure are further described with reference to the accompanying drawings wherein.

DETAILED DESCRIPTION

In general, with existing fractional-N phase-locked loops (PLLs), the control of switching the divider among multiple different frequencies, so as to adjust the instantaneous divide ratio and thus achieve an average of the multiple frequencies, is accomplished by accumulating a fractional divide control number, and using any accumulator overflow to adjust a divide ratio of the divider. In such existing PLLs, a lack of phase coherency of a frequency A signal, which is synthesized after dwelling an arbitrary time at a different frequency B with respect to an originally generated frequency A signal, results from accumulating a different fractional divide number (e.g., the one used to synthesize frequency B) in the accumulator. More particularly, if the fractional divide number added to the accumulator causes a roll over, the corresponding carry bit of the accumulator will no longer start in phase with the carry bit that was used earlier to generate the original frequency. The result is that the signal generated by the frequency switching does not align in phase with the originally generated signal. Thus, existing techniques for adding numbers to an accumulator to control the instantaneous divide ratio of the fractional-N PLL result in a lack of coherency between an originally generated signal and a subsequently generated signal, after having switched from the original frequency to another frequency and then back again.

To this end, and in accordance with an embodiment of the present disclosure, techniques for phase coherent frequency synthesis applications using a Delta-Sigma Modulator (DSM) are provided. The DSM can be implemented in a fractional-N phase-locked loop (PLL). The DSM is configured to count the number of reference clock cycles of the PLL that have passed since some point in time, such as a reset event. The DSM has multiple accumulator stages, where each stage can accumulate the sum of the previous stage at each reference clock cycle. A fractional divide word fed into the DSM can then be multiplied by the output of each stage of the DSM. In this manner, the DSM is configured to output a sequence of signals that tracks with the reference clock when the PLL tunes to a different frequency and back to the original frequency. Numerous configurations and variations will be apparent in light of this disclosure.

As used herein, the phrases "phase coherent" and "phase coherency" refer to the phase of a sinusoidal PLL output remaining substantially deterministic for a number of different frequencies and/or frequency changes. For example, the frequency of the PLL output may be switched from any frequency to any other frequency (or to multiple other frequencies) and return in-phase to the original frequency. As used herein, the term "sinusoidal" refers to a succession of waves similar to a sine wave, but does not require a waveform that exactly corresponds to a sine wave. For instance, the output sinusoidal waveform may be in the form of a sine wave, square wave, triangle wave, or other desired waveform shape.

Figure 1:
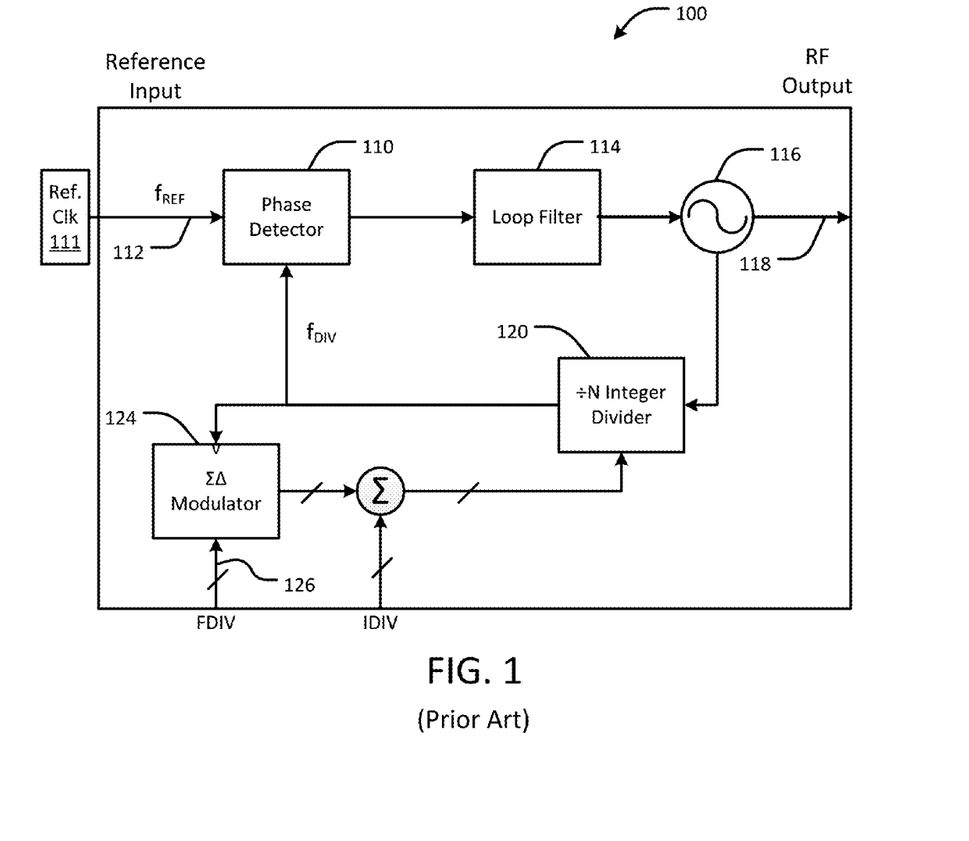
FIG. 1 is a schematic drawing showing an existing Delta-Sigma Modulator (DSM) use case.

FIG. 1 shows an existing fractional-N phase-locked loop (PLL) 100. The PLL 100 includes a phase detector 110 provided with a reference frequency 112 by a reference clock 111. The output of the phase detector 110 is coupled to a loop filter 114 and then to a voltage-controlled oscillator 116, which forms a phase-locked loop output 118. The phase-locked loop output 118 is fed back to the phase detector 110 through a divider 120. Switching of the divider 120 is controlled by a DSM 124. The DSM 124 is provided with a fractional divide control number 126. In such an existing PLL 100, a synchronous reset pulse is used to initialize the state of the PLL.

Figure 2:
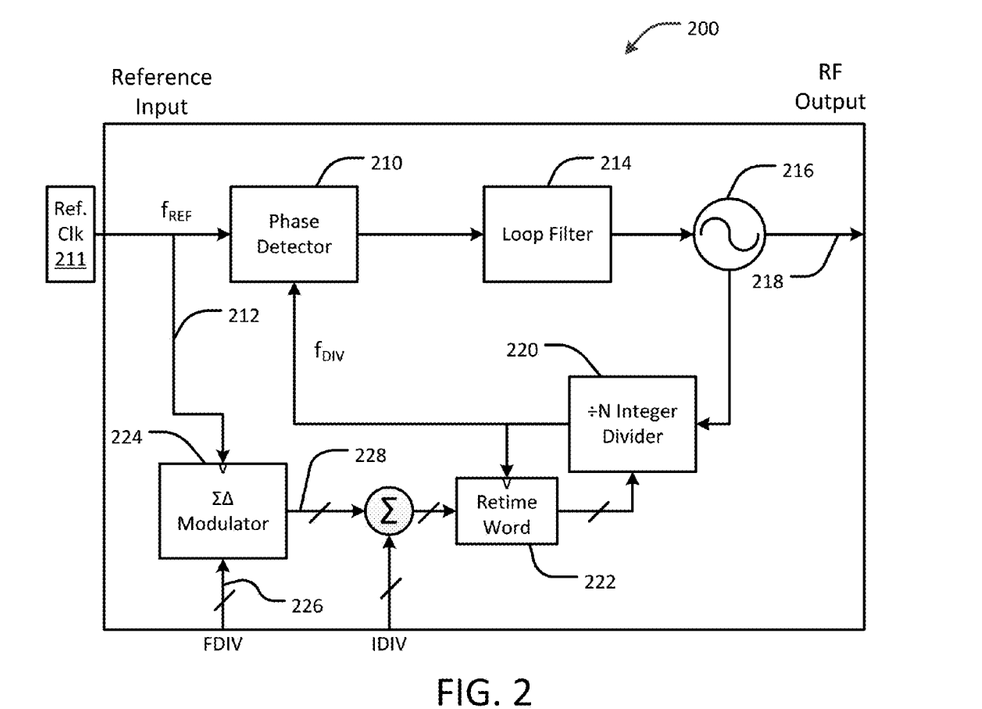
FIG. 2 is a schematic drawing showing an example of a coherent DSM use case, in accordance with an embodiment of the present disclosure.

FIG. 2 shows an fractional-N phase-locked loop (PLL) 200 that utilizes a phase coherent DSM for maintaining phase coherence between a synthesized clock and a reference clock, in accordance with an embodiment of the present disclosure. The PLL 200 includes a phase detector 210 provided with a reference frequency 212 by a reference clock 211. The output of the phase detector 210 is coupled to a loop filter 214 and then to a voltage-controlled oscillator (VCO) 216, which forms a phase-locked loop output 218. The phase-locked loop output 218 (also referred to in this disclosure as an output frequency or tone) is fed back to the phase detector 210 through a divider 220. Switching of the divider 220 is controlled by a retimed word 222. The retimed word 222, captured through asynchronous clock domain crossing logic, is generated by a phase coherent DSM 224. The DSM 224 is provided with a fractional divide control number 226. Before the PLL 200 reaches lock, the reference clock domain and feedback divider clock domain are asynchronous, do not share a known phase relationship, and do not operate at the same frequency. When a new frequency plan is selected for the PLL, the feedback frequency will change while the reference frequency remains the same. During this period, the re-timing circuitry ensures that the fractional divide word of the DSM 224 is correctly received by a loop divider. The loop divider in feedback clock domain receives divide words generated by the DSM from the reference clock domain. Correctly received means that the divide word is received without clock domain crossing timing violations. If the divider fails to receive this word correctly, it will divide by a wrong value and the PLL may fail to lock entirely. In contrast to the DSM 124 of FIG. 1, which is clocked by the output of the divider 120, in this embodiment the DSM 224 is directly clocked by the reference frequency 212. The DSM 224 includes multiple accumulators, also referred to in this disclosure as stages.

The fractional divide control number 226 controls the switching of the divider 220 between at least two different frequencies so as to be able to control the average of the frequencies in terms of a controllable duty cycle. The frequency of the signal 218 output by the PLL 200 can be finely controlled by adjusting the duty cycle. For example, fine frequency control may be obtained by adding the fractional divide control number to the count in the accumulator of the DSM 224 for the duty cycle.

In operation, PLL 200 uses the reference frequency 212, which is the desired PLL output frequency divided by N. The VCO 216 generates the synthesized output frequency 218. If the reference frequency 212 and the PLL output 218 divided by N are the same frequency and at the same phase, then the phase detector 210 has zero output, the VCO-controlled output frequency 218 is not changed, and the PLL phase is locked. When the reference frequency 212 and the PLL output 218 divided by N are different, either having the same frequency but a different phase, or are at different frequencies, the phase detector 210 output controls VCO 216 to either speed up and increase the PLL output frequency 218 or slow down to decrease the PLL output frequency 218. The VCO 216 is thus adjusted via the phase detector 210, until the reference frequency and PLL output 218 divided by N are locked in both frequency and phase.

In various embodiments, a frequency control word (FCW) (e.g., the fractional divide control number 226) can be used to change a frequency in the phase coherent fractional-N PLL 200. The FCW is a binary number that is added to the accumulators of the DSM 224 to control a divide ratio in an analog or digital fractional-N phase-locked loop such that a phase of the synthesized frequency is deterministic from a given point in time with respect to the reference signal. The result of adding the FCW binary number to the DSM 224 is an output word 228 (the divide ratio) that controls the switching between states of the PLL to vary the average output frequency 218 via the divider 220. The result is that the PLL output 218 is a signal whose frequency may be altered between, for example, two frequencies associated with two multipliers in the DSM 224.

Figure 3:
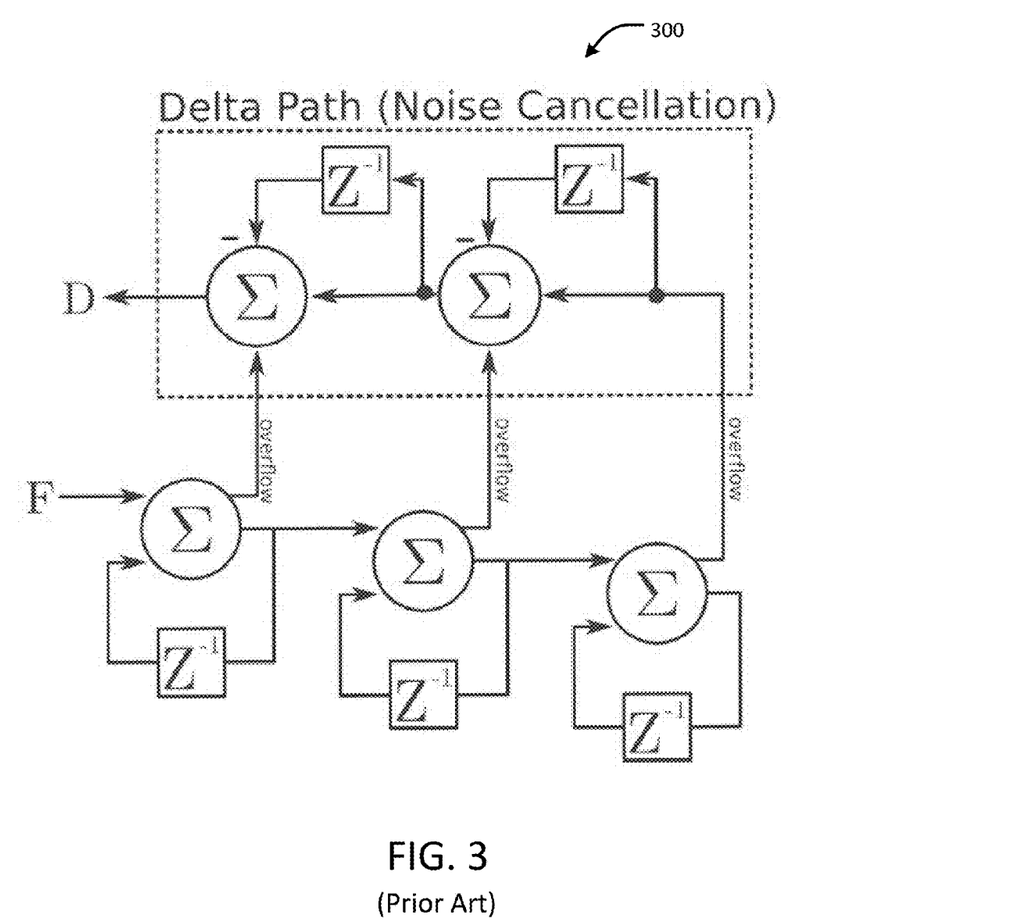
FIG. 3 is a schematic drawing showing an existing MASH-111 (multi-stage noise shaping structure)
Figure 4:
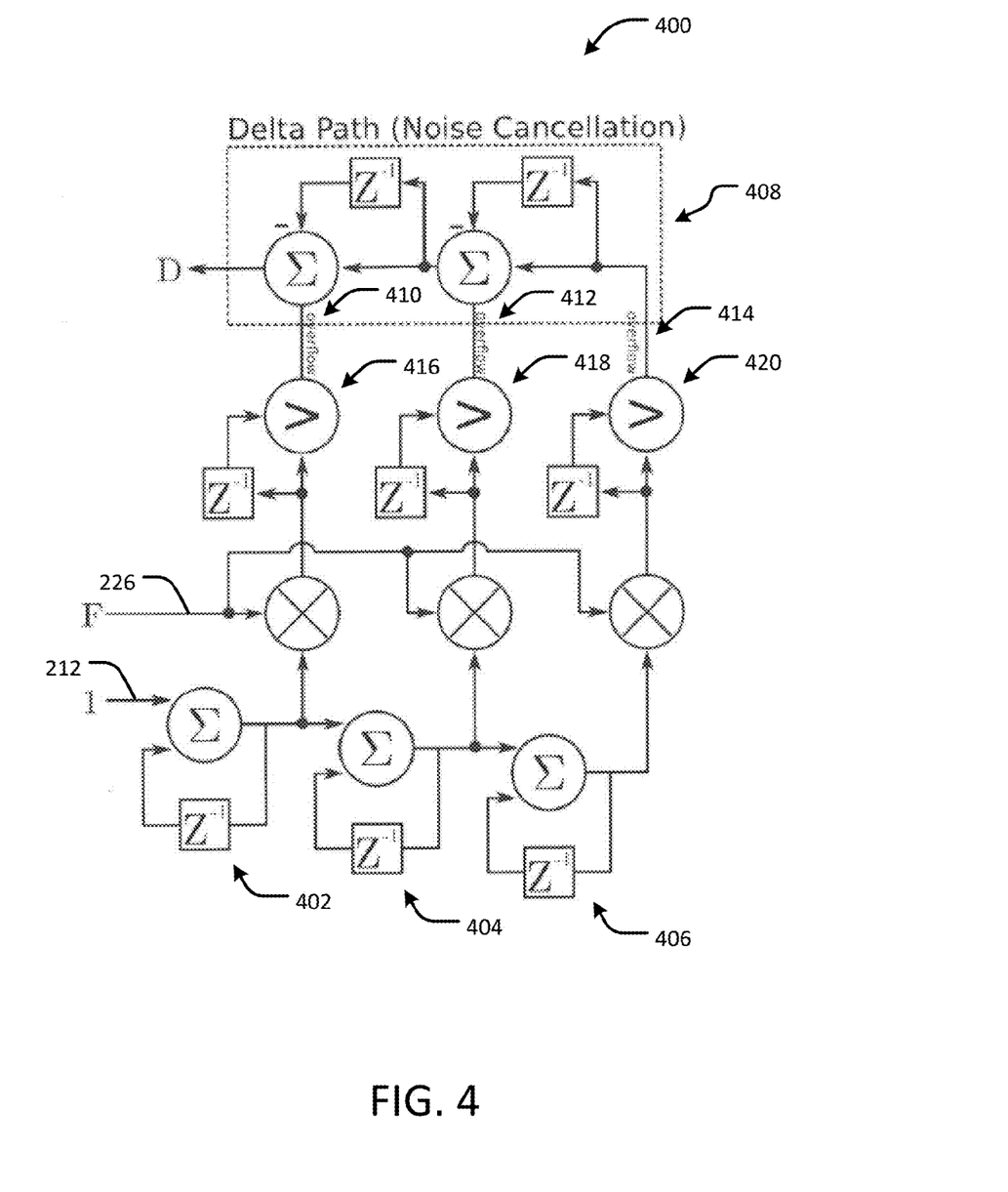
FIG. 4 is a schematic drawing showing an example of a coherent MASH-111, in accordance with an embodiment of the present disclosure.

For comparison, FIG. 3 shows an existing MASH-111 (multi-stage noise shaping structure) DSM, generally indicated at 300. FIG. 4 shows an example phase coherent implementation of a MASH-111 DSM, generally indicated at 400, in accordance with an embodiment of the present disclosure. According to this embodiment, the DSM 224 of FIG. 2 can be a modified MASH-111 DSM, such as shown in FIG. 4. The MASH-111 DSM 400 generally cancels, reduces or otherwise shapes noise generated by the phase detector 210 or other components of the PLL 200. The modified MASH-111 DSM 400 is configured to generate a sequence of signals, which are dependent on the reference frequency 212. By generating the sequence of signals from the reference frequency, instead of from the divider as with existing techniques, the generated sequence has a phase bias that is always the same when returning to a different fractional divide state, as if the PLL never tuned away from the frequency of the reference.

The modified MASH-111 DSM 400 includes several feed-forward accumulator stages 402, 404, 406. The first accumulator 402 in the summation path of the modified MASH-111 DSM 400 is incremented by one at each clock cycle of the reference clock. This operation counts the number of reference clock cycles modulo $2^B$ (where B is the number of bits) that have passed since, for example, a given reset event or other point in time. In the existing MASH-111 DSM 300, the accumulator is incremented by a fractional word modulo $2^B$. A fundamental phase coherency problem occurs because when the output signal is synthesized by a different FCW, the accumulator adds an arbitrary word for an arbitrary time, which can be viewed as a phase bias error with respect to the previous phase relationship. By contrast, in the modified MASH-111 DSM 400 according to an embodiment, the fractional control word is multiplied by the output of each of the feed forward accumulator stages 402, 404, 406. It will be understood that this technique can be extended to any feed-forward DSM, and is not limited to the MASH-111 as shown in FIG. 4.

The multiplication operation in the MASH-111 DSM 400 can be computed modulo $2^B$ to match the behavior of the DSM. Since a modulo operation that is a power of two is a truncation of most significant bits, in some cases only the bottom B bits of the multiplication are kept or computed.

A delta path 408 of the modified MASH-111 DSM 400 can receive an overflow event 410, 412, 414 of each accumulator 402, 404, 406. In the existing MASH-111 DSM 300, the overflow event is the carry-out bit of the addition operation. However, by contrast, in the modified MASH-111 DSM 400, the overflow event can occur as part of the multiplication operation. Therefore, in accordance with an embodiment, overflow detection circuitry 416, 418, 420 compares the truncated word of a stage against the value of the truncated word of the same stage from a previous clock cycle. The overflow detection circuitry 416, 418, 420 generates the overflow condition bit 410, 412, 414 that can be used in the delta path 408.

Figure 5:
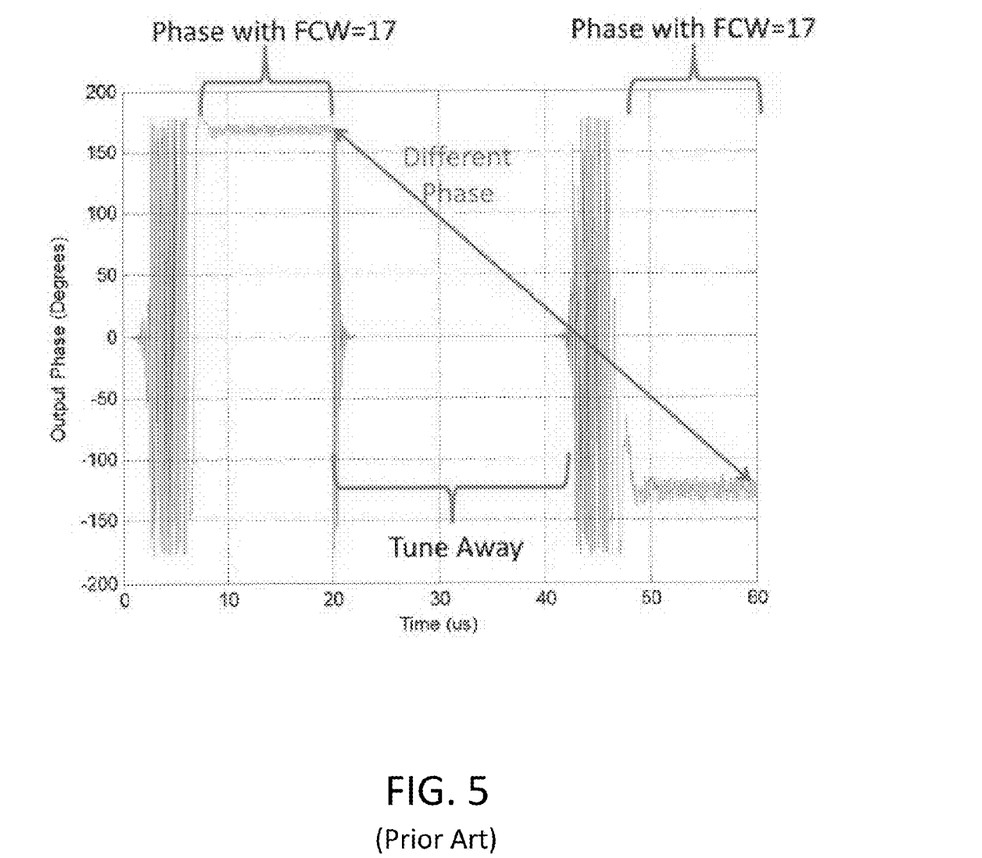
FIG. 5 is a graph showing an existing DSM phase-locked loop (PLL)

FIG. 5 shows an example phase relationship of the VCO output 118 of the existing PLL 100 against the reference clock for the case where the PLL tuned away from a locked frequency by changing the fractional divide word and then tuned back to the previous locked state. As can be seen, the PLL output phase is different after the frequency changes.

Figure 6:
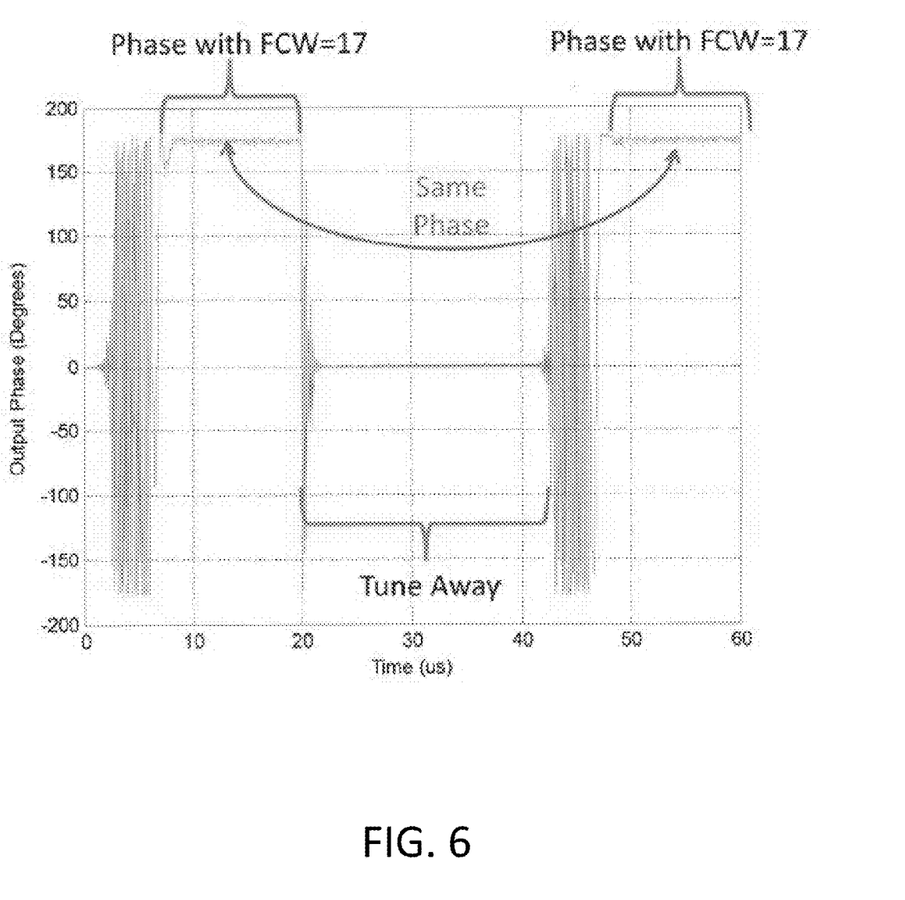
FIG. 6 is a graph showing an example of a coherent DSM PLL, in accordance with an embodiment of the present disclosure.

FIG. 6 shows, in accordance with an embodiment, an example phase relationship of the VCO output 218 of the example PLL 200 against the reference clock for the case where the PLL tuned away from a locked frequency by changing the fractional divide word and then tuned back to the previous locked state. As can be seen, the PLL returns to the desired phase relationship despite an arbitrary dwell and accumulation time while operating at a different frequency.

Figure 7:
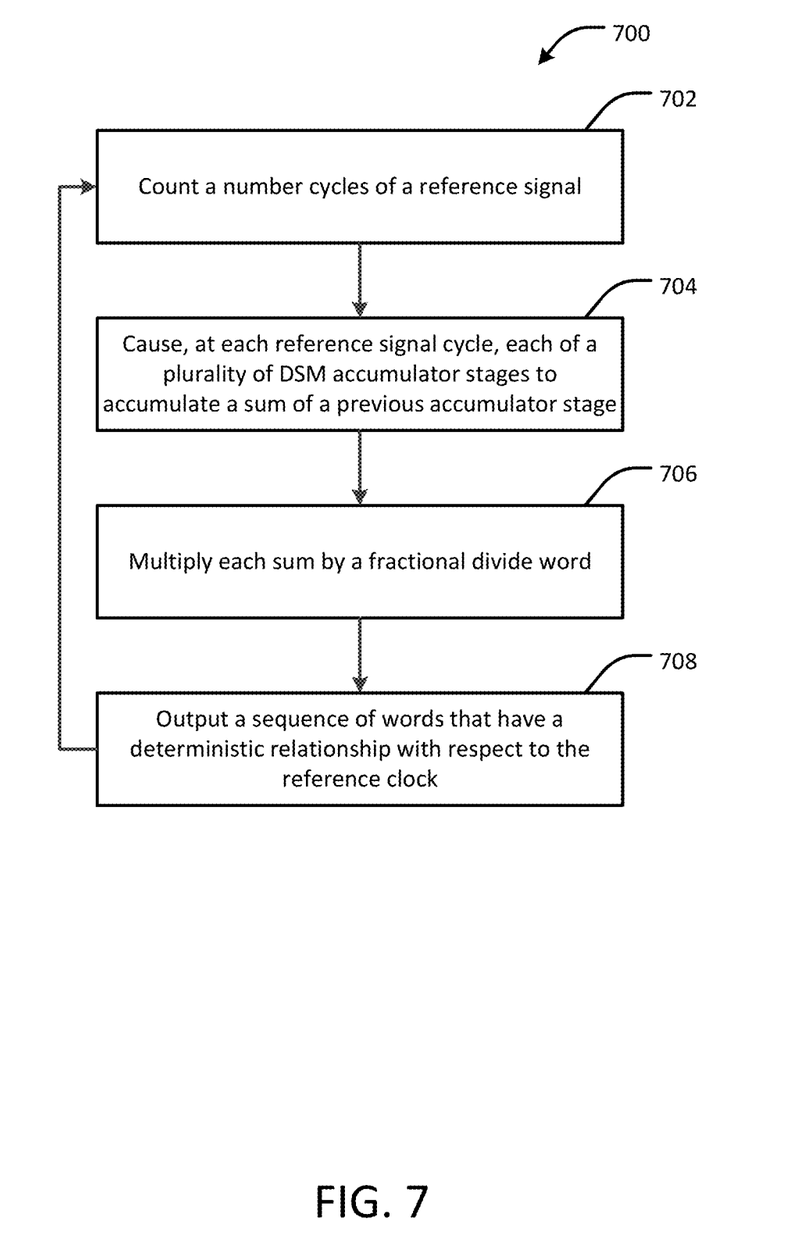
FIG. 7 is a flow diagram of an example methodology for phase coherent frequency synthesis applications using a DSM, in accordance with an embodiment of the present disclosure.

FIG. 7 is a flow diagram of an example methodology 700 for phase coherent frequency synthesis applications using a DSM, in accordance with an embodiment of the present disclosure. The methodology 700 may be performed, for example, by the example fractional-N PLL 200 of FIG. 2. The method 700 includes counting 702, by a phase coherent delta-sigma modulator (DSM) having a plurality of feed-forward accumulator stages, a number of cycles of a reference signal generated by a reference clock operatively coupled to the DSM. The method 700 further includes causing 704, at each cycle of the reference signal, each subsequent stage of a plurality of stages of the DSM to accumulate a sum of a previous stage of the DSM. The method 700 further includes multiplying 706 each sum by a fractional divide word, thereby causing the DSM to output a sequence of signals that tracks with the reference clock. In some cases, the method 700 includes controlling a divide ratio in an analog or digital fractional-N phase-locked loop such that a phase of the synthesized frequency is deterministic from a given point in time with respect to the reference signal. In some cases, the method 700 includes shaping, by a numerically controlled oscillator (NCO) operatively coupled to the reference clock, quantization noise due to phase truncation in the NCO, thereby maintaining no phase bias. In some cases, the method 700 includes truncating the result of multiplying the sum by the fractional divide word. In some cases, the method 700 includes comparing the truncated result of each stage of the DSM with a previous truncated multiplied result of the same stage, and generating carry-out bits for a delta path of the DSM based on the comparison. In some cases, the accumulator stages of the DSM are serially arranged, such as shown in FIG. 4. In some cases, the number of cycles of the reference signal is the number of cycles of the reference signal generated by the reference clock since a given reset event or other point in time.

Applications of the present disclosure include, but are not limited to, any application in which phase coherency is desired, including direct digital synthesis (DDS) devices, phase-locked loop (PLL) devices, or any digital circuit that accumulates phase and then truncates a portion of the phase during the conversion to amplitude (e.g., where phase error is injected through the use of a DSM). In such applications, using a phase coherent DSM, such as disclosed herein, helps ensure that the exact phase is returned when switching between frequencies.

While embodiments of the present disclosure have been described, it will be understood that other similar embodiments may be used or modifications or additions may be made to the described embodiments for performing the same or similar functions without deviating therefrom. Therefore, the present disclosure should not be limited to any single embodiment, but rather construed in breadth and scope in accordance with the recitation of the appended claims.

What is claimed is:

1. A phase coherent fractional-N phase-locked loop synthesizer for maintaining phase coherence of a synthesized frequency, the synthesizer comprising:
    a phase detector; and
    a phase coherent delta-sigma modulator (DSM) having a plurality of feed-forward accumulator stages, the DSM and the phase detector each being clocked by a reference clock configured to generate a cyclical reference signal, the DSM configured to:
        count a number of the cycles of the reference signal;
        cause, at each cycle of the reference signal, each subsequent stage of the stages of the DSM to accumulate a sum of a previous stage of the DSM; and
        multiply each sum by a fractional divide word to produce a multiplier output,
        thereby causing the DSM to output a sequence of words that have a deterministic relationship with respect to the reference clock.

2. The synthesizer of claim 1, wherein the DSM is configured to control a divide ratio in an analog or digital fractional-N phase-locked loop such that a phase of the synthesized frequency is deterministic from a given point in time with respect to the reference signal.

3. The synthesizer of claim 1, wherein the DSM is configured to shape quantization noise from phase truncation in a numerically controlled oscillator (NCO) operatively coupled to the reference clock, thereby maintaining no phase bias.

4. The synthesizer of claim 3, wherein the DSM is configured to compare a truncated multiplied output of each stage of the DSM with a previous truncated multiplied output of the same stage, and to generate carry-out bits for a delta path of the DSM based on the comparison.

5. The synthesizer of claim 1, wherein the stages are serially arranged.

6. The synthesizer of claim 1, wherein the number of cycles of the reference signal is the number of cycles of the reference signal generated by the reference clock since a given reset event.

7. The synthesizer of claim 1, further comprising a plurality of phase coherent fractional-N phase-locked loop synthesizers.

8. A method of maintaining phase coherence of a synthesized frequency using a phase coherent delta-sigma modulator (DSM), the method comprising:
    counting, by a phase coherent delta-sigma modulator (DSM) having a plurality of feed-forward accumulator stages, a number of cycles of a reference signal generated by a reference clock operatively coupled to the DSM;
    causing, at each cycle of the reference signal, each subsequent stage of a plurality of stages of the DSM to accumulate a sum of a previous stage of the DSM; and
    multiplying each sum by a fractional divide word,
    thereby causing the DSM to output a sequence of words that have a deterministic relationship with respect to the reference clock.

9. The method of claim 8, further comprising controlling a divide ratio in an analog or digital fractional-N phase-locked loop such that a phase of the synthesized frequency is deterministic from a given point in time with respect to the reference signal.

10. The method of claim 8, further comprising shaping quantization noise from phase truncation in a numerically controlled oscillator (NCO) operatively coupled to the reference clock, thereby maintaining no phase bias.

11. The method of claim 10, comparing a truncated result of each stage of the DSM with a previous truncated multiplied result of the same stage, and generating carry-out bits for a delta path of the DSM based on the comparison.

12. The method of claim 8, wherein the stages are serially arranged.

13. The method of claim 8, wherein the number of cycles of the reference signal is the number of cycles of the reference signal generated by the reference clock since a given reset event.

14. A phase coherent fractional-N phase-locked loop synthesizer for maintaining phase coherence of a synthesized frequency, the synthesizer comprising:
- a reference clock; and
- means operatively coupled to the reference clock and configured to output a sequence of signals that tracks with the reference clock.

15. The synthesizer of claim 14, wherein the means is configured to control a divide ratio in an analog or digital fractional-N phase-locked loop such that a phase of the synthesized frequency is deterministic from a given point in time with respect to the reference signal.

16. The synthesizer of claim 15, wherein the means is configured to shape the quantization noise from phase truncation in a numerically controlled oscillator (NCO) operatively coupled to the reference clock, thereby maintaining no phase bias.

17. The synthesizer of claim 16, wherein the means is configured to compare a truncated result of an accumulator stage of a DSM with a previous truncated multiplied result of the same stage, and generate carry-out bits for a delta path of the DSM based on the comparison.

18. The synthesizer of claim 14, further comprising a plurality of phase coherent fractional-N phase-locked loop synthesizers.

* * * * *